US010913999B2

(12) United States Patent
Di Paola et al.

(10) Patent No.: US 10,913,999 B2
(45) Date of Patent: Feb. 9, 2021

(54) BOX COATING APPARATUS FOR VACUUM COATING OF SUBSTRATES, IN PARTICULAR SPECTACLE LENSES

(71) Applicant: Satisloh AG, Baar (CH)

(72) Inventors: Giuseppe Di Paola, Corbetta (IT);
Franco Moreni, Olgiate Olona (IT);
Antonio Corea, Sedriano (IT);
Giuseppe Viscomi, Senago (IT); Frank Breme, Kappel am Albis (CH)

(73) Assignee: Satisloh AG

( * ) Notice: Subject to any disclaimer, the term of this patent is extended or adjusted under 35 U.S.C. 154(b) by 340 days.

(21) Appl. No.: 15/900,988

(22) Filed: Feb. 21, 2018

(65) Prior Publication Data

US 2018/0237907 A1 Aug. 23, 2018

(30) Foreign Application Priority Data

Feb. 22, 2017 (EP) .................................. 17000280

(51) Int. Cl.
*C23C 16/56* (2006.01)
*C23C 14/56* (2006.01)
(Continued)

(52) U.S. Cl.
CPC ........ *C23C 14/564* (2013.01); *C23C 14/0635* (2013.01); *C23C 14/24* (2013.01); *C23C 14/52* (2013.01)

(58) Field of Classification Search
CPC ... C23C 14/564; C23C 14/52; C23C 14/0635; C23C 14/24; C23C 14/54; C23C 14/042; B29D 11/00865
(Continued)

(56) References Cited

U.S. PATENT DOCUMENTS 3,570,449 A * 3/1971 Blecherman .......... C23C 14/545
118/712
3,926,147 A * 12/1975 Steube .................. C23C 14/223
118/723 VE
(Continued)

FOREIGN PATENT DOCUMENTS

JP 61064880 4/1986
JP 10251844 9/1998
(Continued)

OTHER PUBLICATIONS

European Search Report, Applicant: Satisloh AG, Application No. 17000280.2, dated Sep. 12, 2017, 9 pages.
(Continued)

*Primary Examiner* — Rudy Zervigon
(74) *Attorney, Agent, or Firm* — Reising Ethington P.C.

(57) ABSTRACT

A box coating apparatus for coating of substrates comprises a vacuum chamber which contains an evaporation source. A substrate holder is disposed vis-à-vis to the evaporation source so that evaporated material can impinge on substrates held by the substrate holder. Besides the evaporation source and the substrate holder, at least one further functional component is provided, namely a Meissner trap and/or a high vacuum valve mechanism, to which a shield arrangement is assigned to prevent evaporated material from impinging on said component. This shield arrangement has a shutter portion which can be moved from a closed shielding position in which it covers a passageway through the shield arrangement and serves to shield said component, to an open pumping position in which it substantially clears the passageway to allow essentially free passage for gases and vapor, and vice versa.

21 Claims, 11 Drawing Sheets

(51) Int. Cl.
  *C23C 14/24* (2006.01)
  *C23C 14/06* (2006.01)
  *C23C 14/52* (2006.01)

(58) Field of Classification Search
  USPC .................................. 118/723 VE, 723 EB
  See application file for complete search history.

(56) References Cited

U.S. PATENT DOCUMENTS

| | | | | |
|---|---|---|---|---|
| 3,962,988 | A * | 6/1976 | Murayama | C23C 14/32 |
| | | | | 118/723 VE |
| 4,217,855 | A * | 8/1980 | Takagi | C23C 14/221 |
| | | | | 118/719 |
| 4,269,137 | A * | 5/1981 | Johnson | C23C 14/022 |
| | | | | 118/50.1 |
| 4,310,614 | A * | 1/1982 | Connell | C23C 14/022 |
| | | | | 118/719 |
| 4,516,525 | A * | 5/1985 | Bourgeois | C23C 14/30 |
| | | | | 118/688 |
| 4,791,261 | A * | 12/1988 | Phinney | C23C 14/26 |
| | | | | 118/620 |
| 4,876,114 | A * | 10/1989 | Phinney | C23C 14/26 |
| | | | | 427/561 |
| 4,951,604 | A * | 8/1990 | Temple | C23C 14/30 |
| | | | | 118/723 EB |
| 5,121,707 | A | 6/1992 | Kanoo | |
| 5,133,849 | A * | 7/1992 | Kinoshita | C23C 14/0021 |
| | | | | 118/723 VE |
| 5,413,688 | A | 5/1995 | Crowley | |
| 5,423,914 | A * | 6/1995 | Nakamura | C23C 14/08 |
| | | | | 118/719 |
| 5,527,396 | A * | 6/1996 | Saitoh | C23C 16/517 |
| | | | | 118/718 |
| 5,656,141 | A * | 8/1997 | Betz | C23C 14/32 |
| | | | | 118/723 EB |
| 5,858,450 | A * | 1/1999 | Fujimura | C03C 17/001 |
| | | | | 427/9 |
| 5,888,305 | A * | 3/1999 | Szczyrbowski | C23C 14/32 |
| | | | | 118/723 EB |
| 6,101,316 | A * | 8/2000 | Nagashima | B01B 1/005 |
| | | | | 118/723 VE |
| 6,202,591 | B1 * | 3/2001 | Witzman | C23C 14/243 |
| | | | | 118/723 VE |
| 6,319,326 | B1 * | 11/2001 | Koh | C23C 16/4417 |
| | | | | 118/718 |
| 6,367,414 | B2 * | 4/2002 | Witzman | C23C 14/243 |
| | | | | 118/718 |
| 6,481,369 | B1 * | 11/2002 | Takahashi | C23C 14/547 |
| | | | | 118/715 |
| 6,507,698 | B2 * | 1/2003 | Nagashima | C23C 14/12 |
| | | | | 118/723 VE |
| 6,513,451 | B2 * | 2/2003 | Van Slyke | C23C 14/12 |
| | | | | 118/719 |
| 6,649,208 | B2 * | 11/2003 | Rodgers | G01B 11/0616 |
| | | | | 118/708 |
| 6,770,333 | B2 * | 8/2004 | Bruce | C23C 14/30 |
| | | | | 427/255.32 |
| 6,776,847 | B2 * | 8/2004 | Yamazaki | B05D 1/60 |
| | | | | 118/719 |
| 6,863,937 | B2 * | 3/2005 | Bruce | C23C 14/246 |
| | | | | 427/255.32 |
| 6,946,034 | B1 * | 9/2005 | Bruce | C23C 14/246 |
| | | | | 118/719 |
| 7,182,976 | B2 * | 2/2007 | Takahashi | C23C 14/547 |
| | | | | 427/164 |
| 7,214,554 | B2 * | 5/2007 | Winters | H01L 51/0008 |
| | | | | 257/E21.122 |
| 7,931,787 | B2 * | 4/2011 | Hilliard | C23C 14/0068 |
| | | | | 118/723 E |
| 8,022,012 | B2 * | 9/2011 | Moeckly | C23C 14/067 |
| | | | | 118/719 |
| 8,075,947 | B2 * | 12/2011 | Kikegawa | C23C 14/505 |
| | | | | 427/162 |
| 8,290,553 | B2 * | 10/2012 | Moeckly | C23C 14/067 |
| | | | | 118/719 |
| 8,347,814 | B2 * | 1/2013 | Mitchell | C23C 14/225 |
| | | | | 118/715 |
| 8,367,191 | B2 * | 2/2013 | Kikegawa | C23C 14/505 |
| | | | | 351/159.64 |
| 8,475,595 | B2 * | 7/2013 | Pei | C23C 14/22 |
| | | | | 118/715 |
| 8,481,344 | B2 * | 7/2013 | Luu | C23C 14/505 |
| | | | | 118/712 |
| 8,709,540 | B2 * | 4/2014 | Yamazaki | C23C 14/12 |
| | | | | 118/723 VE |
| 8,826,856 | B2 * | 9/2014 | Nagae | C23C 14/083 |
| | | | | 118/723 EB |
| 8,894,769 | B2 | 11/2014 | Chaix et al. | |
| 8,922,790 | B2 * | 12/2014 | Sai | G01B 11/0625 |
| | | | | 356/630 |
| 9,074,283 | B2 * | 7/2015 | Takahashi | C23C 14/32 |
| 10,077,207 | B2 * | 9/2018 | Lee | C23C 14/24 |
| 2001/0005553 | A1 * | 6/2001 | Witzman | C23C 14/243 |
| | | | | 428/402 |
| 2001/0017108 | A1 * | 8/2001 | Nagashima | C23C 14/12 |
| | | | | 118/715 |
| 2002/0003086 | A1 * | 1/2002 | Sferlazzo | C23C 14/044 |
| | | | | 204/298.11 |
| 2002/0005347 | A1 * | 1/2002 | Sferlazzo | C23C 14/044 |
| | | | | 204/192.1 |
| 2002/0162740 | A1 * | 11/2002 | Wang | B01J 19/0046 |
| | | | | 204/298.11 |
| 2003/0019430 | A1 * | 1/2003 | Malischke | C23C 14/30 |
| | | | | 118/723 EB |
| 2003/0029382 | A1 * | 2/2003 | Takahashi | C23C 14/547 |
| | | | | 118/712 |
| 2003/0145792 | A1 * | 8/2003 | Honda | B05B 17/04 |
| | | | | 118/726 |
| 2004/0099216 | A1 * | 5/2004 | Koh | H01J 37/317 |
| | | | | 118/723 CB |
| 2004/0159283 | A1 * | 8/2004 | Harada | C23C 14/24 |
| | | | | 118/712 |
| 2004/0173160 | A1 * | 9/2004 | Misiano | C23C 14/0021 |
| | | | | 118/723 EB |
| 2005/0081790 | A1 * | 4/2005 | Konishi | C23C 14/544 |
| | | | | 118/723 R |
| 2006/0081459 | A1 | 4/2006 | Tsai et al. | |
| 2006/0260547 | A1 * | 11/2006 | Zultzke | C23C 14/22 |
| | | | | 118/726 |
| 2010/0221450 | A1 * | 9/2010 | Paton | C23C 14/0605 |
| | | | | 427/566 |
| 2011/0097511 | A1 * | 4/2011 | Shiono | C23C 14/0031 |
| | | | | 427/523 |
| 2011/0111581 | A1 * | 5/2011 | Shiono | C23C 14/083 |
| | | | | 438/516 |
| 2012/0064315 | A1 * | 3/2012 | Kikegawa | C23C 14/505 |
| | | | | 428/213 |
| 2012/0083050 | A1 * | 4/2012 | Luu | H01L 21/2855 |
| | | | | 438/5 |
| 2013/0239891 | A1 * | 9/2013 | Sonoda | C23C 14/042 |
| | | | | 118/719 |
| 2013/0263784 | A1 * | 10/2013 | Lee | C03C 17/00 |
| | | | | 118/723 R |
| 2014/0014921 | A1 * | 1/2014 | Choi | H01L 51/56 |
| | | | | 257/40 |
| 2014/0199493 | A1 * | 7/2014 | Shiono | C23C 14/022 |
| | | | | 427/532 |
| 2017/0051394 | A1 * | 2/2017 | Takiguchi | H05B 33/10 |
| 2017/0117119 | A1 * | 4/2017 | DeVito | H01J 37/32458 |
| 2018/0057927 | A1 * | 3/2018 | MacCrady | C23C 14/26 |
| 2019/0136364 | A1 * | 5/2019 | Zheng | C23C 14/042 |
| 2019/0214234 | A1 * | 7/2019 | Devito | C23C 14/0047 |

(56) References Cited

U.S. PATENT DOCUMENTS

2019/0242007 A1* 8/2019 Rotte ................. C23C 14/30
2020/0087778 A1* 3/2020 MacCrady ........... C23C 14/243

FOREIGN PATENT DOCUMENTS

| JP | 2007332433 A | 12/2007 |
| JP | 2010106289 A | 5/2010 |
| KR | 1020140081194 | 1/2015 |

OTHER PUBLICATIONS

Satisloh Brochure "An introduction to the coating of ophthalmic lenses", 2nd Edition, 2006, 36 pages.

* cited by examiner

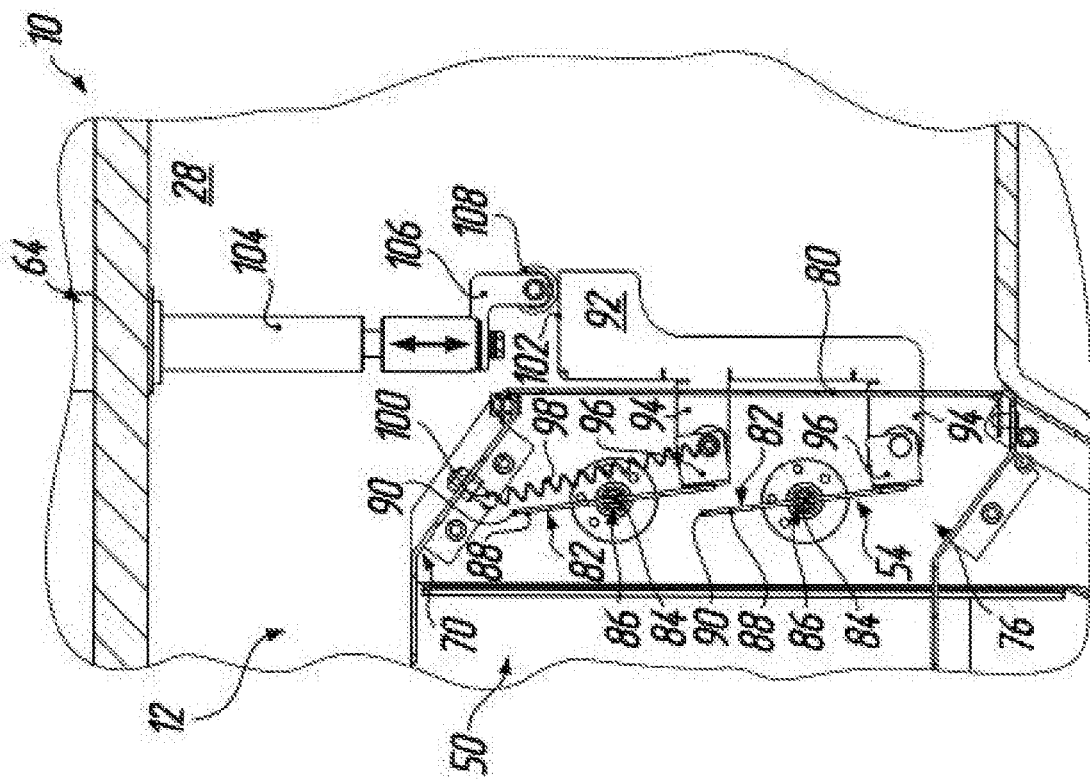

BOX COATING APPARATUS FOR VACUUM COATING OF SUBSTRATES, IN PARTICULAR SPECTACLE LENSES

TECHNICAL FIELD OF THE INVENTION

The present invention generally relates to a box coating apparatus for vacuum coating of substrates. Such apparatus generally serves the purpose of high vacuum deposition of multilayer thin films on substrates of various materials, both organic and inorganic, usually used in optical applications. In particular, the present invention relates to a box coating apparatus for vacuum coating of spectacle lenses, which has useful application for large-scale production of spectacle lenses. In this case, typically, the box coating apparatus serves the purpose of applying a multilayer antireflection (AR) coating on the spectacle lenses in order to provide the latter with a low residual reflection and a desired color. It can however also be used for other coating purposes, e.g., for applying on top of such AR coating a top coating (TC) selected from a group comprising hydrophobic, oleophobic and dust repelling coatings.

BACKGROUND OF THE INVENTION

The coating technology at issue—that is known per se—is a physical vapor deposition (PVD) process, to be more precise a coating process by thermal evaporation. In thermal evaporation the bulk of the deposition material undergoes a transition from solid to vapor state by thermal heating or electron bombardment. The evaporated material is then carried to the substrate where the growing of the thin film occurs. The critical parameters of such a coating technology are mainly the average speed of the evaporated particles and their angular distribution. The base pressure must be kept in the high vacuum range to minimize the number of impact events between the evaporant particles and the residual gases in the vacuum chamber where the process takes place. High vacuum allows the particles to have a sufficiently long "mean free path" for the thin film to grow at the substrate level. High vacuum also ensures that, as the evaporated material is transported from the evaporator to the surfaces being coated, it does not (or to a very limited extent only) undergo chemical reactions with gases in the chamber. For these reasons the chamber needs to be pumped down to, e.g., about $3 \times 10^{-3}$ Pa before coating is begun. The pumping down of the vacuum chamber however entails the problems explained in the following.

FIGS. 12 to 14 show a previously known box coating apparatus 10—namely the box coating apparatus "1200 DLX box coater" available from the present applicant Satisloh AG, Switzerland—in a partly simplified or schematic manner. The basic structure and functions of such box coating apparatus 10 are described in the brochure "An Introduction To The Coating Of Ophthalmic Lenses", $2^{nd}$ Edition 2006, available from the present applicant, to which explicit reference shall be made at this point.

Accordingly, the box coating apparatus 10 basically has a vacuum chamber 12 which contains an evaporation source 14 and a substrate holder 16 for holding a plurality of substrates (not shown) in a known manner. The substrate holder 16 is formed as a dome disposed vis-à-vis to the evaporation source 14 and rotatable by a dome rotary drive 18 (omitted in FIG. 14) about an axis of rotation R which passes through the evaporation source 14, so that the substrates held by the substrate holder 16 on a plurality of circles can be moved on circular paths about the axis of rotation R with a respective constant spacing relative to the evaporation source 14.

As further procedural equipment of the box coating apparatus 10 which is located in the vacuum chamber 12 and sensitive to thin film depositions a Meissner trap 20 and substrate heaters 22 are shown. The Meissner trap 20 essentially has a coil 24 (cf. FIG. 14) that can be held either at a temperature below −100° C. or at room temperature. At pressures below about $10^{-2}$ Pa as the vacuum chamber 12 is pumped down, the greater part of the residual gas—as much as 90%—is water vapor. Free water vapor would take a long time to remove and hence would result in long process cycles. To avoid this effect, the Meissner trap freezes the water molecules to its trap surface. The wet frozen water molecules remain at the trap surface throughout the process. The water is released (evaporated) and pumped out only after coating is complete. Substrate heaters 22 on the other hand are typically provided in case glass lenses are to be coated with typical materials such as $MgF_2$. In such case the substrates must be heated to about 300° C. by the substrate heaters in order to obtain excellent coating quality. Heaters however can also serve to degas the coating system in regular intervals.

Still further procedural equipment for generating the vacuum in the box coating apparatus 10 can be taken from FIG. 14 and is generally denoted with the reference sign 25 (pumping arrangement) in FIG. 14. According to FIG. 14 (left-hand side) a high vacuum valve mechanism 26, sensitive to thin film depositions as well, is mounted in a chamber appendage 28 to the vacuum chamber 12—also known as "high vacuum valve region" of the box coating apparatus 10—and can be operated, i.e. opened and closed via a valve actuator 30. An efficient Roots pump 32 and rotary vane pump 34 combination is connected to the chamber appendage 28 through a roughing (fore vacuum) valve 36. A cooling baffle 38 and an oil diffusion pump 40 are arranged below the high vacuum valve 26. To prevent oil vapor from the diffusion pump 40 escaping into the vacuum chamber 12 through the open high vacuum valve mechanism 26, the cooling baffle 38 is mounted above the oil diffusion pump 40. Further, a bypass valve 42 with a direct connection to the rotary pumps 32, 34 is located on the fore vacuum side of the oil diffusion pump 40.

A control system (not shown) actuates the valves 26, 36 and 42 in the correct order when the vacuum chamber 12 is being pumped down by the pumping arrangement 25, wherein the sequence of operations basically is as follows: When all pumps 32, 34, 40 and the cooling baffle 38 are ready for operation, the roughing valve 36 is opened and the Roots pump 32 and rotary vane pump 34 combination initially pumps the vacuum chamber 12 down to some 5 Pa. If the fore vacuum pressure of the oil diffusion pump 40 should rise beyond a programmed limit during this step, the roughing valve 36 is closed and the bypass valve 42 is opened until the pressure limit is reached again. The initial configuration is then restored. When the pressure in the vacuum chamber 12 drops to 5 Pa, the roughing valve 36 to the vacuum chamber 12 is closed and the bypass valve 42 to the oil diffusion pump 40 is opened. The high vacuum valve 26 is opened shortly after this and the vacuum chamber 12 is then pumped down by the oil diffusion pump 40 until the initial pressure of the process (high vacuum) is attained. At a pre-programmed value of the pressure, the Meissner trap 20 cooling is turned on in order to boost the pump capacity for water vapor. The maximum initial pressure for the vapor-deposition process typically is $3 \times 10^{-3}$ Pa. The Meissner trap 20 is heated again after the deposition process, the high vacuum valve 26 is closed, and the vacuum chamber 12 is let down to atmosphere with an air inlet valve (not shown).

To prevent any undesired deposition of the evaporated material on the sensitive procedural equipment, in particular the Meissner trap 20 and the high vacuum valve mechanism 26 in the high vacuum valve region, full and fixed shields 44, 46 or masks are provided in the vacuum chamber 12 at positions facing the evaporation source 14 so as to shield the respective equipment against the evaporant particles travelling through the vacuum chamber 12 during the coating process. As compared to FIG. 12 these shields 44, 46 have been omitted in FIG. 13 for illustrative purposes. According to FIG. 12 the shield 44 for the Meissner trap 20 is composed of solid steel sheets forming a continuous wall in front of the Meissner trap 20, whereas the shield 46 for the high vacuum valve 26 is arranged at the entrance of the chamber appendage 28 and formed like a lamella grid with a fixed lamella angle so that the respective lamella portions directly face the evaporation source 14, as can be seen best in FIG. 14. Likewise, parts of housings 48 of the substrate heaters 22 shield the actual heating elements (not shown) thereof against undesired deposition of the evaporated material.

Although the known shields 44, 46 and housings 48 safely protect the sensitive components against undesired contamination and related malfunctions, they also form a "rugged" interior surface portion of the vacuum chamber 12 with undercut areas and winding gas or vapor ways. This "rugged" interior surface portion of the vacuum chamber 12 however entails a certain gas/vapor flow resistance, so that the "pumping down" of the vacuum chamber 12 to the above-mentioned process vacuum can be quite time-consuming. Naturally, it would be desirable in the mass production of spectacle lenses to minimize the time required by such non-productive sub-processes.

Further, it is known to arrange shutters or masks inside the vacuum chamber of a vacuum vapor-deposition apparatus, which can be moved into and away from the evaporation path between the evaporation source and the substrate holder.

In this regard document JP 2007-332433 A discloses a vacuum vapor-deposition apparatus comprising two evaporation sources, wherein a shutter is provided which is pivotable about a rotary shaft between the evaporation sources for selectively covering one of the evaporation sources. In another known arrangement which is shown in document US 2006/0216161 A1 the vacuum chamber of a vacuum vapor-deposition apparatus is divided by a wall into a first chamber volume and a second chamber volume. Assigned to each chamber volume are a respective pumping unit and a respective evaporation source (source of material). The wall has a recess centered with respect to the evaporation path between the evaporation source assigned to one of said chamber volumes and the substrate holder. The recess can be tightly plugged or cleared by a toggling mask actuated by an external toggling device. In both of the known cases—JP 2007-332433 A and US 2006/0216161 A1—the closed shutter/mask serves to prevent contamination of one of the evaporation sources during operation of the other of the evaporation sources.

Furthermore, document JP 2010-106289 A discloses a vacuum vapor-deposition apparatus comprising a shutter that can be rotated by a shutter drive mechanism about a rotary shaft between a shielding position in which it blocks the evaporation path between an evaporation source (crucible) and the substrates held by a substrate holder, and an open position in which it clears the evaporation path. In this case the shutter is intended to either prevent deposition of the vaporized material on the substrates under unstable evaporation conditions, e.g. at the very beginning of the evaporation process, or allow deposition of the vaporized material on the substrates once the evaporation is stable, in order to achieve film formation of constant high quality on the substrates.

Finally, documents U.S. Pat. No. 5,413,688, JP 10-251844 A, JP 61-64880 A and KR 10-2014-0081194 show further shutter arrangements in a chamber for vacuum vapor-deposition, which serve to shield of a viewport, a quartz sensor, film thickness monitor heads and a crystal sensor, respectively, with respect to the evaporation source.

It is desirable, starting from the prior art as outlined above and shown in FIGS. 12 to 14 for instance, of creating a box coating apparatus for vacuum coating of substrates, in particular spectacle lenses, which is configured for enhancing vacuum procedures while keeping a high level of protection of sensitive parts of the apparatus from the deposition process, so that the box coating apparatus is especially useful for large-scale production of spectacle lenses.

SUMMARY OF THE INVENTION

According to one aspect of the invention—in the case of a box coating apparatus for vacuum coating of substrates, in particular spectacle lenses, which comprises a vacuum chamber that can be evacuated by a pumping arrangement and contains an evaporation source for evaporating coating material, wherein a substrate holder for holding a plurality of substrates is disposed vis-à-vis to the evaporation source in the vacuum chamber so that coating material evaporated by the evaporation source can impinge on substrates held by the substrate holder, and wherein, besides the evaporation source and the substrate holder, at least one further functional component is provided, namely at least a Meissner trap and/or a high vacuum valve mechanism, to which in the vacuum chamber a shield arrangement is assigned, that is located between the evaporation source and the functional component so as to prevent coating material evaporated by the evaporation source from impinging on the functional component—the shield arrangement assigned to the Meissner trap and/or the high vacuum valve mechanism comprises a shutter portion which can selectively be transferred from a closed shielding position in which the shutter portion covers a passageway leading through the shield arrangement, while the shutter portion serves to shield the functional component optionally together with a remainder of the shield arrangement, to an open pumping position in which the shutter portion substantially clears the passageway to allow essentially free passage for gases and vapor, and vice versa.

In this context the terms "cover" and "clear" in particular shall not be understood to be limiting as to the spatial order of the shutter portion and the remainder of the shield arrangement at issue with respect to the evaporation source. Although it would be preferred in most cases to arrange the shutter portion behind the remainder of the shield arrangement as seen from the evaporation source toward the respective shield arrangement since any actuating mechanism associated with the shutter portion could be shielded against deposition of the evaporated coating material, in principle the shutter portion could also be located in front of the remainder of the shield arrangement as seen from the evaporation source toward the shield arrangement, or within the passageway leading through the shield arrangement.

In other words, the basic idea of the present invention is to cover or shield one or more of the functional components of the box coating apparatus other than the evaporation source and the substrate holder, including at least the Meissner trap and/or the high vacuum valve mechanism, i.e. the functional components comprised in the pumping system of the box coating apparatus that are sensitive to thin film depositions, with an "intelligent mask system" that can be open or close depending on the process phase. During the pumping down phase the shutter portion of the shield arrangement can be kept completely open, i.e. remain in the open pumping position with a substantially cleared passageway for gases and vapor through the shield arrangement, thereby maximizing the conductance towards the pumping arrangement and therefore also increasing the speed of the pumping arrangement. This gives benefits in reducing the pumping down time and increasing therefore the productivity of the box coating apparatus. Otherwise, when the deposition process is on, there is no need for having high values of pumping speed. In this case the shutter portion of the shield arrangement can be kept close, i.e. remain in the closed shielding position, so that the passageway leading through the shield arrangement is blocked and the respective sensitive functional component behind the shield arrangement is not covered with thin films. This increases again the productivity of the box coating apparatus by reducing maintenance time (no need to clean the functional components from the deposited thin films) and increasing the duty cycle. Another benefit is related to a reduced consumption of process gases which are injected during some deposition steps, because of the reduced conductance and pumping speed obtained by closing the shutter portion of the shield arrangement.

As indicated before, the functional component at issue forms part of a group of functional components comprising at least one of the Meissner trap and the high vacuum valve mechanism, but optionally also a heating device, a vacuum gauge, a deposition sensor device and/or an operator viewport into the vacuum chamber, also depending on the field of application of the box coating apparatus. However, the two main functional components of the box coating apparatus to be shielded with such an "intelligent mask system" are both the Meissner trap and the high vacuum valve region including the high vacuum valve mechanism. Up to now these two functional components have been protected by means of full and fixed masks as described before. This of course helps in preventing any deposition on the two sensitive functional components but is not an optimized solution that maximizes pumping speed during the pumping down phase. A related advantage of using the shield arrangement according to the invention for the Meissner trap lies in the fact that the efficiency of the Meissner trap can be increased because the passageway through the assigned shield arrangement, once cleared by the shutter portion, increases the likelihood that, within a given period of time, water molecules reach the trap surface and are frozen to it. Basically, the same applies to the high vacuum valve mechanism: in consequence of a cleared passageway in the shield arrangement assigned to the high vacuum valve region it is easier for free molecules in the vacuum chamber to reach the high vacuum valve mechanism within a given period of time.

Nevertheless, besides the Meissner trap and the high vacuum valve region, other functional components of the box coating apparatus could benefit if also protected by an "intelligent mask system" as follows. A heating device, e.g. electrical resistive top heaters that are used for heating up the vacuum chamber for vacuum leak tests or the like, can be uncovered during the pumping down phase and then can be masked and protected during the deposition with a further shield arrangement according to the invention. Further, a vacuum gauge can be protected by a further shield arrangement according to the invention unless when fully exposed during process steps that require gas injection. Furthermore, in case of a deposition sensor device, such as a quartz microbalance head, a movable shutter portion of a further shield arrangement according to the invention can be opened and closed with optimized timings in order to minimize the exposition of the sensor to the deposition while sampling the deposition rate with a suitable frequency. Moreover, a movable shutter portion of a further shield arrangement according to the invention can protect an operator viewport from deposition, and can be removed when the operator needs to look inside the vacuum chamber.

As to the more specific design (structure and function) of the shield arrangement, several possibilities are conceivable, also depending on the functional component to be protected. In a first alternative of the shield arrangement, presently preferred to be used for the Meissner trap, the shield arrangement can further have at least one fixed shield element provided with at least one aperture, whereas the shutter portion comprises at least one movable shutter element provided with at least one masking area which is adapted in size and geometry to substantially cover the aperture in the shield element, wherein the shutter element can be moved relative to the shield element in order to selectively cover the aperture of the shield element with the masking area of the shutter element in the shielding position of the shutter portion, or uncover the aperture of the shield element by the masking area of the shutter element in the pumping position of the shutter portion so as to substantially clear the passageway through the aperture. As viewed from the evaporation source toward the respective functional component, e.g. the Meissner trap, the shutter element can be arranged either in front of the shield element or behind the shield element, the latter being currently preferred. This arrangement with complementary elements at any rate allows to switch between two positions, namely a maximum opening area or passageway and a minimal opening area or passageway (some minimal space between the shield element and the shutter element will always be there). The movement actuation however could also allow intermediate relative positioning of the two elements in order to regulate the conductance/protection level continuously.

Although a rotational or pivotal movement of the shutter element relative to the shield element is conceivable, in this instance, the shutter element of the shutter portion is preferably arranged to be linearly moved relative to the shield element of the shield arrangement. For example, the shutter element can be arranged to be linearly movable toward and away from the shield element to cover or clear the passageway.

With regard to minimum installation space requirements it is further preferred, however, if the shutter element of the shutter portion is arranged to be moved in parallel with the shield element of the shield arrangement. This can be either an up/down movement of the shutter element, a lateral movement or any oblique movement thereof, also depending on the available installation situation and space.

In a second alternative of the shield arrangement, currently preferred to be used for the high vacuum valve region with the high vacuum valve mechanism, the shield arrangement can further have at least one fixed shield element provided with at least one opening area, whereas the shutter portion comprises at least one slat element which is located in or adjacent to (i.e. in front of or behind) the opening area and arranged to be pivoted about a pivot axis that is oriented transverse with respect to the opening area, wherein the slat element has a wide face side and a narrow edge side and can be pivoted about the pivot axis into a state in which its face side essentially faces the evaporation source in the shielding position of the shutter portion, or into a state in which a surface area of its edge side only restricts a free cross-section of the opening area of the shield element in the pumping position of the shutter portion so as to substantially clear the passageway through the opening area. Again, this lamella-type arrangement, in which the at least one slat element and the opening area of the shield element are complementary sized and shaped, at any rate allows to switch between two positions, namely a maximum opening cross-section or passageway (free cross-section through the fixed shield element minus the surface area of the narrow edge side of the slat element) and a minimal opening cross-section or passageway (some minimal gap between the slat element and the shield element will always be there). The movement actuation however could again also allow intermediate relative positioning of the two elements in order to regulate the conductance/protection level as desired.

In this alternative of the shield arrangement the shutter portion can comprise at least two slat elements located in or adjacent to the opening area and arranged to be pivoted about pivot axes extending in parallel and oriented transverse with respect to the opening area. Accordingly, the shutter portion can have a set of complementary slat elements as shields rotating all in the same direction (similarly to venetian blinds), or a set of complementary slat elements as shields rotating in different directions, or a set of slat elements as shields some fixed and some rotating, wherein all these arrangements allow to modify configuration, shape and total conductance of the shield (from a maximum open area to a minimum one, passing through intermediate positions) by rotating the slat elements either independently or dependently from each other.

Further, with respect to low complexity and expenditure it is preferred if the slat elements of a set of slat elements are coupled by a connecting piece to be pivotable about their respective pivot axes at the same time and in the same direction of rotation. This also facilitates setting of a passageway with a defined cross-sectional area and main orientation.

Furthermore, in one preferred embodiment of the shield arrangement according to the second alternative, at least one slat element is biased by a spring element into the state in which a surface area of its edge side only restricts the free cross-section of the opening area of the shield element in the pumping position of the shutter portion. Accordingly, the open pumping position of the shutter portion is set as the normal condition so that the shutter portion needs to be operated only in case the related functional component is to be protected against deposition of the evaporated material. As a matter of course, a corresponding spring bias can be provided for at least one of the movable shutter elements of the shield arrangement according to the above described first alternative.

In a third alternative of the shield arrangement the shutter portion could be a solid flag that can change angular position about a vertically extending axis in front of the functional component to be protected. In a fourth alternative of the shield arrangement the shutter portion could be similar to camera (optical) mechanical shutters. In respect of all these four alternatives of the shield arrangement it should be noted that the movable shutter portions could never have a fully closed gap with the remainder of the shield arrangement. A minimum opening will always be there since the parts at issue are not necessarily closing on each other with sealing measures (O-rings or gaskets), which are neither provided for nor necessary.

Continuing the concept of the invention, it can be provided for that the shutter portion or at least a part thereof can automatically be transferred from its closed shielding position to its open pumping position, and vice versa. As compared to manual operation, which is conceivable as well, automatic operation of the shield arrangement advantageously allows for remote control and preprogrammed routines as are desirable in the mass production of spectacle lenses in particular. In this case the shutter portion or at least a part thereof can be operatively connected to an actuator that serves to automatically transfer the shutter portion or the part thereof from its closed shielding position to its open pumping position, and vice versa. Basically, the actuator can be a linear motion actuator or a rotary motion actuator, mainly depending on the type of the shield arrangement.

In case of an actuator for operating the shutter portion of the shield arrangement, preferably, the actuator can be located outside of the vacuum chamber. As compared to an in-vacuum actuator, such as a directly connected in-vacuum motor, which is in principle conceivable, the out-of-vacuum arrangement not only allows for easy servicing of the actuator but also is advantageous with respect to a low risk of vacuum contamination within the vacuum chamber and as such contributes to reducing the pumping down time. In this instance the actuator can be operatively connected to the shutter portion or at least a part thereof via an air-vacuum feed-through, either of linear motion type or of rotational movement type, depending on the type of actuator used.

If it is necessary or desirable to finely control the relative position of the shutter portion with respect to the remainder of the shield arrangement—e.g., in order to set any intermediate position or influence the opening/closing speed—a stepper motor can be used for the actuator. Especially in the case of an out-of-vacuum actuator, however, the actuator preferably comprises a pneumatically actuated piston-cylinder-arrangement for selectively switching from the closed shielding position to the open pumping position of the shutter portion, and vice versa (two positions only), that is economically available.

Finally, and again with a view to low complexity and expenditure, preferably the arrangement can be such that the actuator is operatively connected to the above described connecting piece in order to simultaneously pivot the slat elements by one and the same actuator. Generally, this concept can be used where two or more shutter or slat elements are to be moved at the same time and in the same linear direction or sense of rotation, as the case may be.

BRIEF DESCRIPTION OF THE DRAWINGS

The invention is explained in more detail in the following by way of a preferred embodiment of a box coating apparatus for vacuum coating of substrates such as spectacle lenses with reference to the accompanying, partly simplified or schematic drawings. For simplification of the illustration, apart from parts of the cladding and door of the box coating apparatus, the electron beam gun with shutter, the operating unit and control system (electrical cabinet), screens, handling devices and deposits for the substrates and consumables, some of the supply and conditioning devices—inclusive of lines, hoses and pipes—for current (transformers), compressed air, vacuum (high vacuum pump set) and cooling water (water thermo conditioner, water chiller) as well as the measuring, maintenance and safety devices, in particular, were also mostly omitted from the drawings, in every instance to the extent that they are not required for the understanding of the invention. These omitted parts, assemblies and devices, in structure and function, are known to the person ordinarily skilled in the art anyway. In the drawings:

FIG. 4 shows a cut-out sectional view, to an enlarged scale, of the box coating apparatus according to FIG. 1 in correspondence with the section line IV-IV in FIG. 3, with slat elements of the shutter portion of the first shield arrangement being pivoted into the open pumping position;

FIG. 5 shows a cut-out sectional view, to an enlarged scale, of the box coating apparatus according to FIG. 1 corresponding to the section shown in FIG. 4, with slat elements of the shutter portion of the first shield arrangement however being pivoted into the closed shielding position;

FIG. 14 shows a longitudinal sectional view of the known box coating apparatus according to FIG. 12, wherein, in particular, an example of a known pumping arrangement for evacuating the vacuum chamber of the box coating apparatus is schematically illustrated on the left-hand side in FIG. 14.

DETAILED DESCRIPTION OF THE PREFERRED EMBODIMENT

Figure 14:
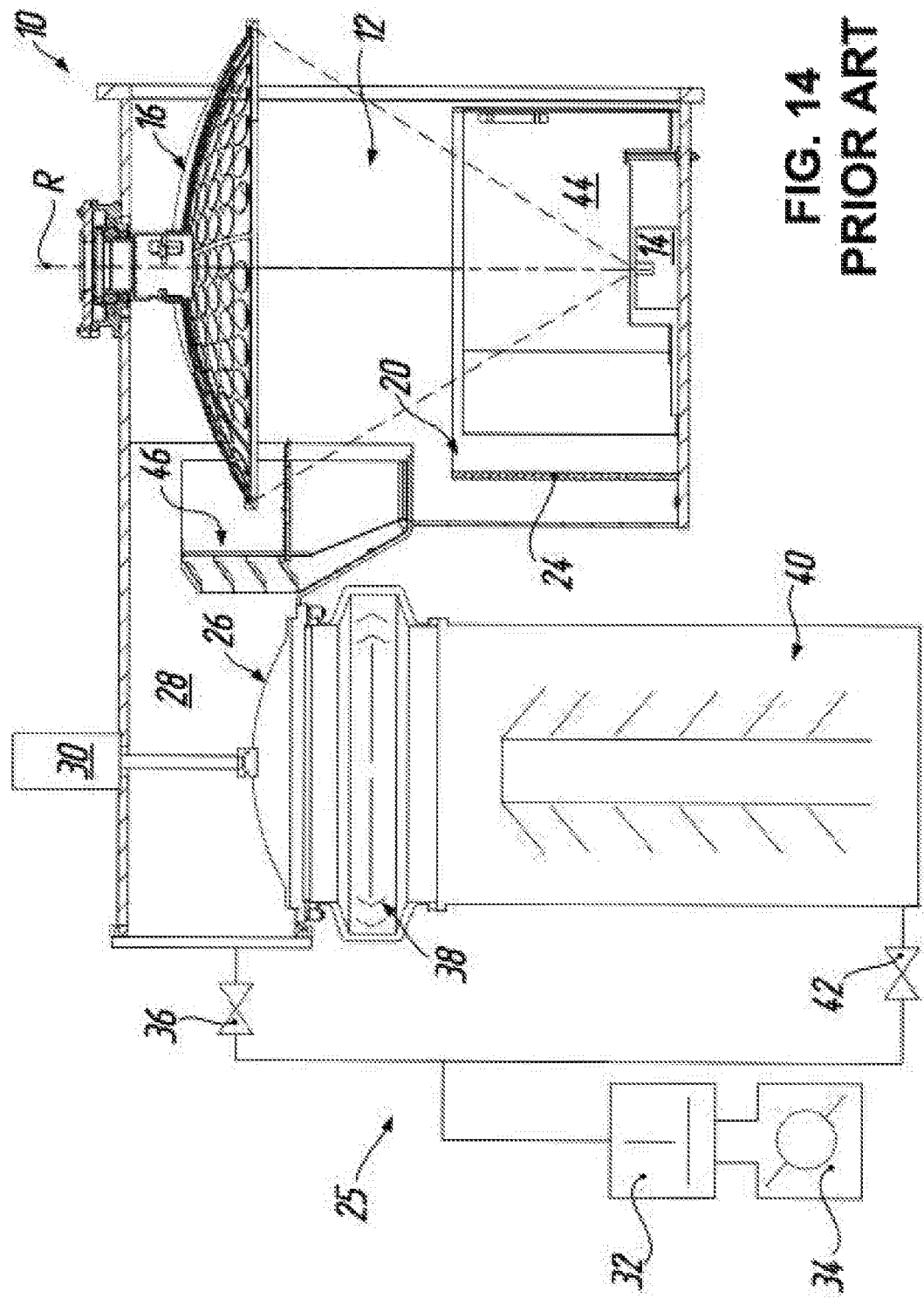
FIG. 14) have been omitted to simplify the drawing, as indicated before.

A box coating apparatus for vacuum coating of substrates (not shown in the drawings), particularly spectacle lenses, is denoted by 10 in FIGS. 1 to 8. As indicated before, such box coating apparatus 10 generally has a vacuum chamber 12 which can be evacuated by a pumping arrangement in a manner known per se (cf. FIG. 14 at 25). The vacuum chamber 12 contains an evaporation source 14 for evaporating coating material. A substrate holder 16 for holding a plurality of substrates is disposed vis-à-vis to the evaporation source 14 in the vacuum chamber 12 so that the coating material evaporated by the evaporation source 14 can impinge on substrates held by the substrate holder 16.

Besides the evaporation source 14 and the substrate holder 16 various functional components are provided in or adjacent to the vacuum chamber 12. These functional components include at least a Meissner trap 20 and a high vacuum valve mechanism 26 (cf. FIGS. 3 and 14). As further functional components heating devices 22 (quartz lamp heating systems) are shown. Still further functional components that are not shown in the drawings comprise in a manner known per se a vacuum gauge, a deposition sensor device, an operator viewport into the vacuum chamber 12, etc.

In the illustrated embodiment a first shield arrangement 50 is assigned to the high vacuum valve mechanism 26 and located between the evaporation source 14 and the high vacuum valve mechanism 26 at the chamber appendage 28 of the vacuum chamber 12, whereas a second shield arrangement 52 is associated with the Meissner trap 20 and arranged between the evaporation source 14 and the Meissner trap 20. With their respective position in front of the respective functional component 20, 26 when viewed from the evaporation source 14, the shield arrangements 50, 52 are intended in the first place to prevent coating material evaporated by the evaporation source 14 from impinging on the respective functional component 20, 26.

Further, as will be explained in more detail below, each shield arrangement 50, 52 comprises a shutter portion 54, 56 which can selectively be transferred from a) a closed shielding position in which the shutter portion 54, 56 covers a passageway 58, 60 leading through the respective shield arrangement 50, 52, so that the shutter portion 54, 56 serves to shield the related functional component 20, 26 together with a remainder of the respective shield arrangement 50, 52, to b) an open pumping position in which the shutter portion 54, 56 substantially clears the passageway 58, 60 to allow essentially free passage for gases and vapor, thereby considerably reducing the time required for pumping down of the vacuum chamber 12 prior to the actual deposition process, and vice versa.

In the following the related details of the first shield arrangement 50 for the high vacuum valve mechanism 26 will be discussed with reference to FIGS. 2 to 5, whereas the corresponding details of the second shield arrangement 52 for the Meissner trap 20 will be described referring to FIGS. 6 to 9. In both exemplary cases the shutter portion 54, 56, i.e. parts thereof can automatically—as contrasted to manually—be transferred from the closed shielding position to the open pumping position, and vice versa. To be more precise, in both exemplary cases actuators 62 are provided and operatively connected to parts of the shutter portions 54, 56, which serve to automatically transfer the related parts of the shutter portions 54, 56 from the closed shielding position to the open pumping position, and vice versa. Structure and function of these actuators 62, which are basically the same for the first shield arrangement 50 and the second shield arrangement 52 in the illustrated examples, will be explained later with reference to FIGS. 10 and 11 taking the second shield arrangement 52 as example. It should be noted at this point already that, in the illustrated examples, all actuators 62 are located outside of the vacuum chamber 12 (see FIG. 1). Further, the exemplary actuators 62 without exception are operatively connected to the related shutter portion 54, 56 via a respective air-vacuum feed-through 64 that will be described as well.

Figure 1:
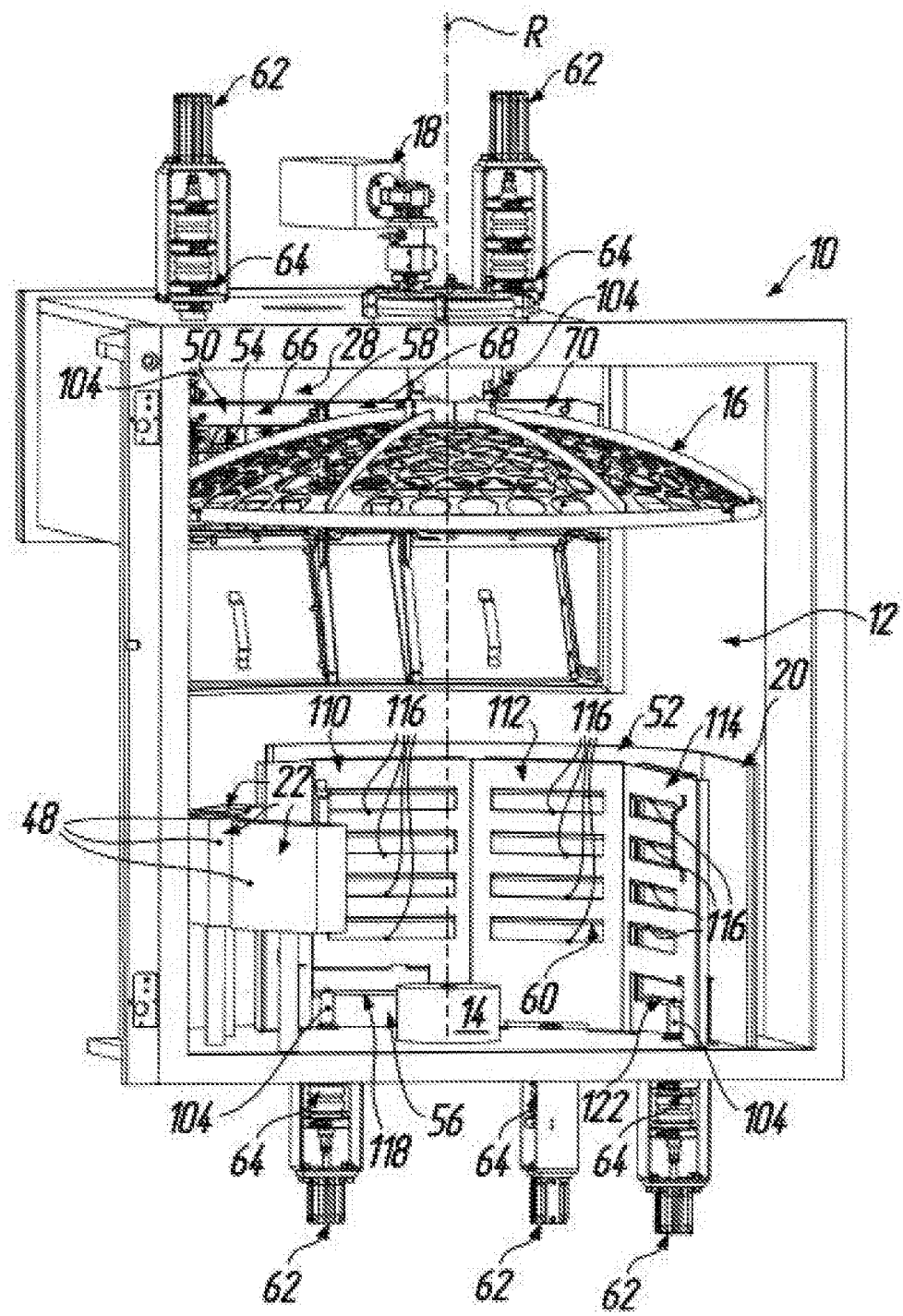
FIG. 1 shows a perspective view of a box coating apparatus according to the invention for, in particular, vacuum coating of spectacle lenses, obliquely from above and front left, with view onto a first shield arrangement assigned to a high vacuum valve mechanism behind a substrate holder and a second shield arrangement assigned to a Meissner trap, wherein a previously known pumping arrangement with a high vacuum valve mechanism and an associated valve actuator (cf.
Figure 2:
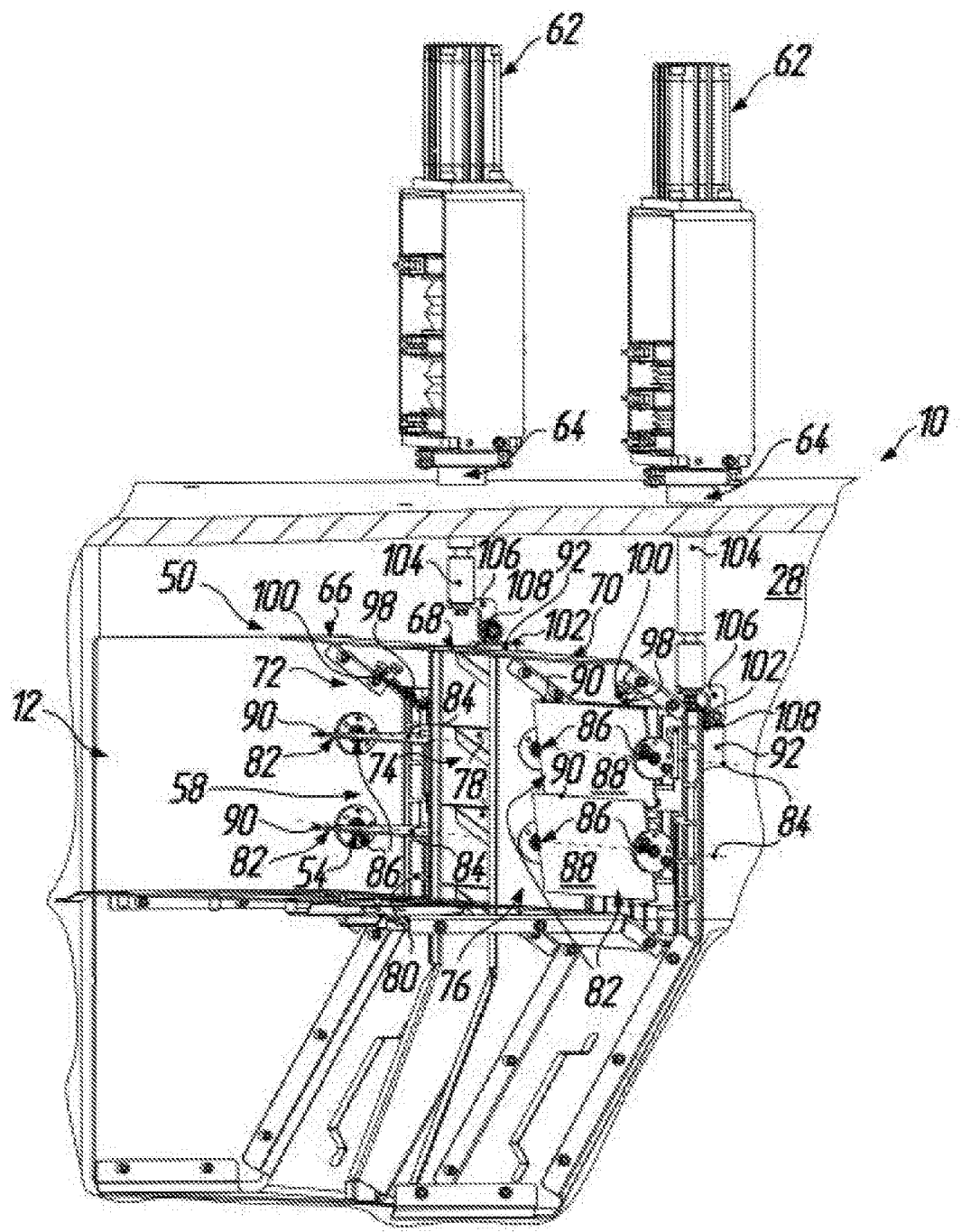
FIG. 2 shows a cut-out perspective view, obliquely from above and front right and to an enlarged scale, which is broken away along a plane extending transverse and close to the first shield arrangement, of the box coating apparatus according to FIG. 1, wherein a shutter portion of the first shield arrangement has a plurality of slat elements arranged in pairs and located in respective opening areas of associated fixed shield elements, with the left-hand side slat elements being pivoted into an open pumping position and the right-hand side slat elements being pivoted to a closed shielding position by a respectively related actuator shown at the top of FIG. 2.
Figure 3:
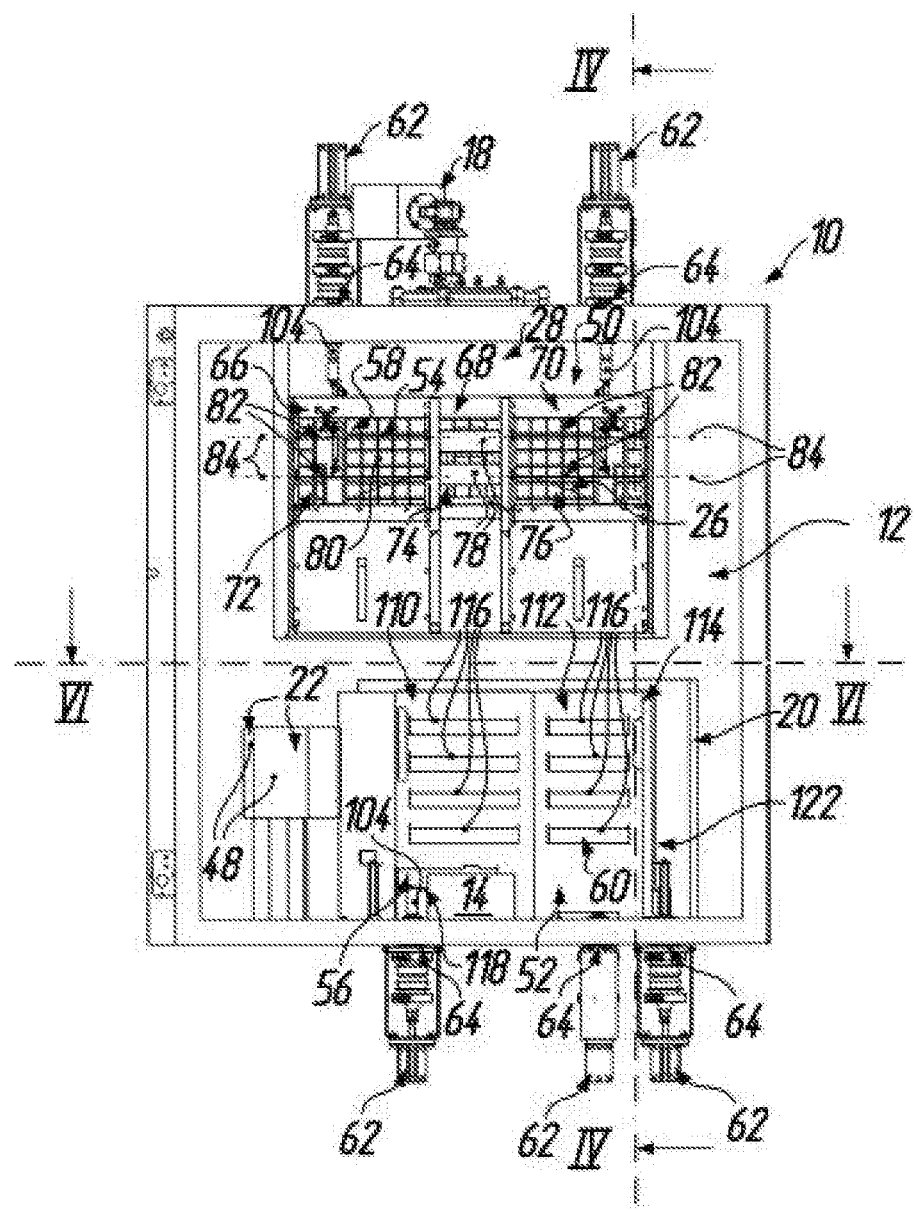
FIG. 3 shows a front view of the box coating apparatus according to FIG. 1, with a substrate holder and the valve actuator for the high vacuum valve mechanism being omitted to better see the first shield arrangement, wherein a respective shutter portion of the first and second shield arrangements is illustrated in the open pumping position substantially clearing passageways through the shield arrangements to allow essentially free passage for gases and vapor.
Figure 6:
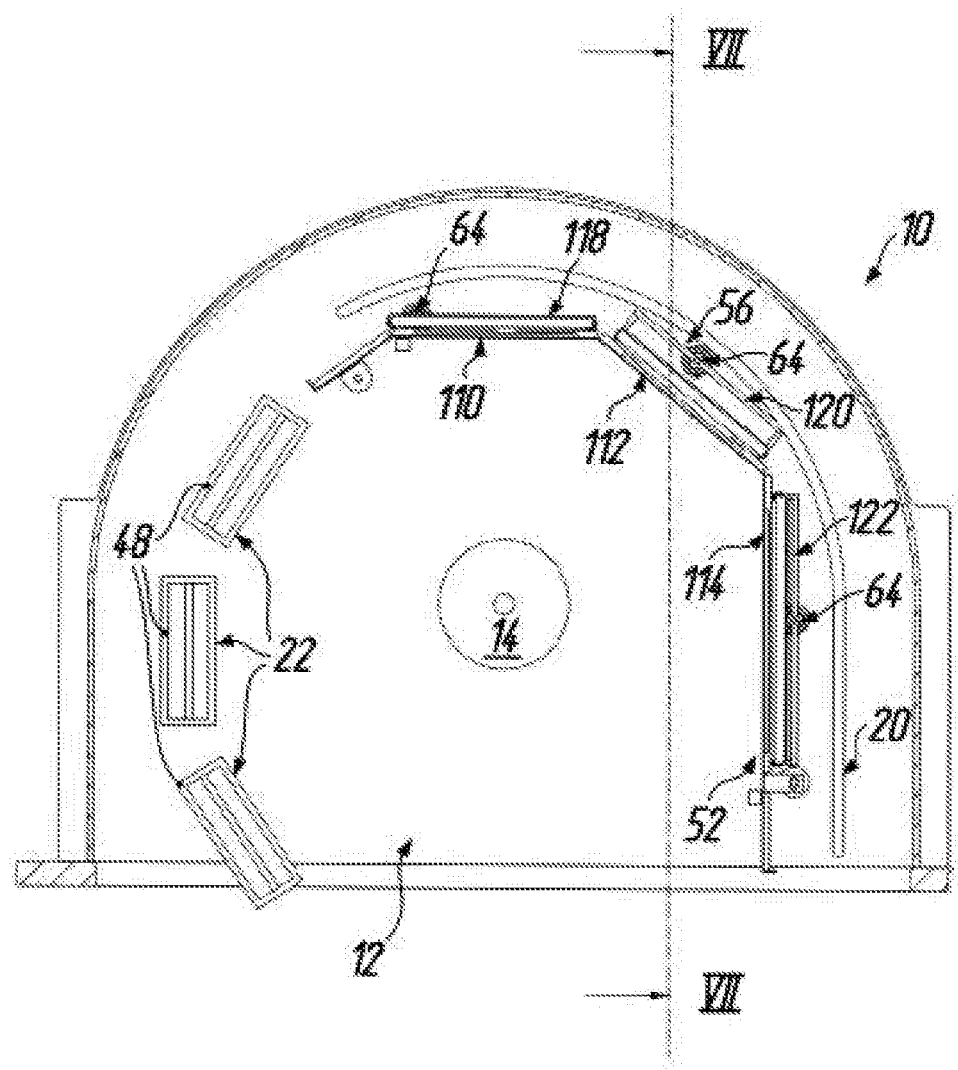
FIG. 6 shows a sectional view of the box coating apparatus according to FIG. 1 in correspondence with the section line VI-VI in FIG. 3, for further illustration of the second shield arrangement from the top.

As can best be seen in FIGS. 2 and 3, the first shield arrangement 50 further has three fixed shield elements 66, 68, 70 constructed from sheet metal parts that are suitably welded and screwed together. Each shield element 66, 68, 70 is provided with an opening area 72, 74, 76. In the opening area 74 of the middle shield element 68 two protective plates 78 are fixedly mounted to form kind of a lamella grid with a fixed lamella angle so that the respective protective plate 78 substantially faces the evaporation source 14. As viewed from the front a grate 80 is mounted behind the shield elements 66, 68, 70, which in width and height extends across the shield elements 66, 68, 70.

Further, according to FIG. 2 in particular, in the illustrated example the shutter portion 54 of the first shield arrangement 50 has four slat elements 82 in total, which are located in the opening areas 72, 76 of the outer two shield elements 66, 70. The slat elements 82 are made of flat sheet material, and each have a substantially rectangular shape. Furthermore, the slat elements 82 are each arranged to be pivoted about a related pivot axis 84 that is oriented transverse with respect to the respective opening area 72, 76. To be more precise, and as is clear from FIGS. 2, 4 and 5, in the example shown two slat elements 82 are located in each opening area 72, 76 and arranged to be pivoted about pivot axes 84 extending in parallel to one another and oriented transverse with respect to the respective opening area 72, 76. Suitably designed bearing points 86 (not shown in greater detail in the figures) are provided on both lateral sides of each slat element 82.

As can further be derived from FIGS. 2, 4 and 5, each slat element 82 has a wide face side 88 and a narrow edge side 90 and can be pivoted about the respective pivot axis 84 a) into a state in which the face side 88 essentially faces the evaporation source 14 in the shielding position of the shutter portion 54 (see FIG. 5 and the right-hand side slat elements 82 in FIG. 2), or b) into a state in which a surface area of the edge side 90 only restricts a free cross-section of the respective opening area 72, 76 of the related shield element 66, 70 in the pumping position of the shutter portion 54 so as to substantially clear the passageway 58 through the respective opening area 72, 76 (see FIG. 4 and the left-hand side slat elements 82 in FIG. 2).

Moreover, in the illustrated example, the slat elements 82 that are arranged in pairs are coupled by a connecting piece 92 to be pivotable about their respective pivot axes 84 at the same time and in the same direction of rotation. According to FIGS. 4 and 5, each connecting piece 92 has two axially spaced linkage arms 94 which extend through the grate 80 to be suitably linked to an assigned bracket 96 attached to the respective slat element 82. The upper slat element 82 of each pair of slat elements 82 is biased by a spring element 98 into the state in which the surface area of its edge side 90 only restricts the free cross-section of the respective opening area 72, 76 of the related shield element 66, 70 in the pumping position of the shutter portion 54. In the embodiment shown the spring element 98 is in the form of a screw tension spring, with an upper end being fixed to the respective shield element 66, 70 via a U-bolt 100, and a lower end suitably linked to the bracket 96 of the related upper slat element 82.

The connecting piece 92, which is formed as sheet metal part as well, further has a bent upper portion (cf. FIG. 2) that defines a contact surface 102 for the associated actuator 62. To be more precise, the actuator 62 has a connecting shaft 104 formed in one or multiple parts that slidingly protrudes into the chamber appendage 28 through the air-vacuum feed-through 64. The free end of the connecting shaft 104 carries a mounting bracket 106 which rotatably mounts a roller element 108. The roller element 108 abuts on the contact surface 102 of the connecting piece 92.

As is clear from FIGS. 4 and 5, by slidingly extending the connecting shaft 104 of the actuator 62 into the chamber appendage 28 along the double arrow depicted in FIG. 4, the connecting piece 92 is pressed down via the roller element 108 against the biasing force of the spring element 98. As the slat elements 82, which are coupled to the connecting piece 92 via the brackets 96, then pivot about their respective pivot axes 84, the connecting piece 92 shifts to the left in FIG. 4 until the position shown in FIG. 5 is reached. During this the roller element 108 rolls on the contact surface 102 of the connecting piece 92. Once the connecting shaft 104 of the actuator 62 is retracted from the position shown in FIG. 5 along the double arrow depicted in FIG. 5 in order to pivot back the slat elements 82 into their position shown in FIG. 4, the connecting piece 92, which is urged with its contact surface 102 against the roller element 108 on account of the biasing force of the spring element 98, follows the connecting shaft 104. During this the connecting piece 92 shifts to the right in FIG. 5 until the position shown in FIG. 4 is reached again, while the roller element 108 rolls back on the contact surface 102 of the connecting piece 92.

Accordingly, the actuator 62 is operatively connected to the connecting piece 92 so as to simultaneously pivot the related slat elements 82 by one and the same actuator 62. As becomes further clear from FIG. 2, the pairs of slat elements 82 can be operated independently from each other because each pair of slat elements 82 has its own actuator 62. This feature for example may be used to generate a flow with a defined twist in the vacuum chamber 12 at the very beginning of the pumping down phase to speed up the evacuation.

Turning now to FIGS. 6 to 9, in the example shown the second shield arrangement 52 assigned to the Meissner trap 20 has three fixed shield elements 110, 112, 114 of different size, which are formed as a substantially flat, rectangular sheet metal part each. As can best be seen in FIG. 6, the shield elements 110, 112, 114 are arranged in an angled configuration that essentially follows the C-shaped curvature of the Meissner trap 20. Each shield element 110, 112, 114 is provided with four slit-like apertures 116 arranged in parallel to one another and each extending in the width direction of the respective shield element 110, 112, 114.

Further, in the illustrated embodiment the shutter portion 56 of the second shield arrangement 52 comprises three movable shutter elements 118, 120, 122 respectively assigned to the shield elements 110, 112, 114 and arranged between the shield elements 110, 112, 114 and the Meissner trap 20. Corresponding to the number of apertures 116 in the assigned shield element 110, 112, 114 (in the example shown four apertures) each shutter element 118, 120, 122 is provided with masking areas 124 which are adapted in size and geometry to substantially cover the related apertures 116 in the respective shield element 110, 112, 114. This can be seen best in FIGS. 7 and 8. According to FIG. 9 in particular, the masking areas 124 (four in this case) can be made up of metal strips which are suitably mounted in a separate frame 126 of each shutter element 118, 120, 122.

Figure 7:
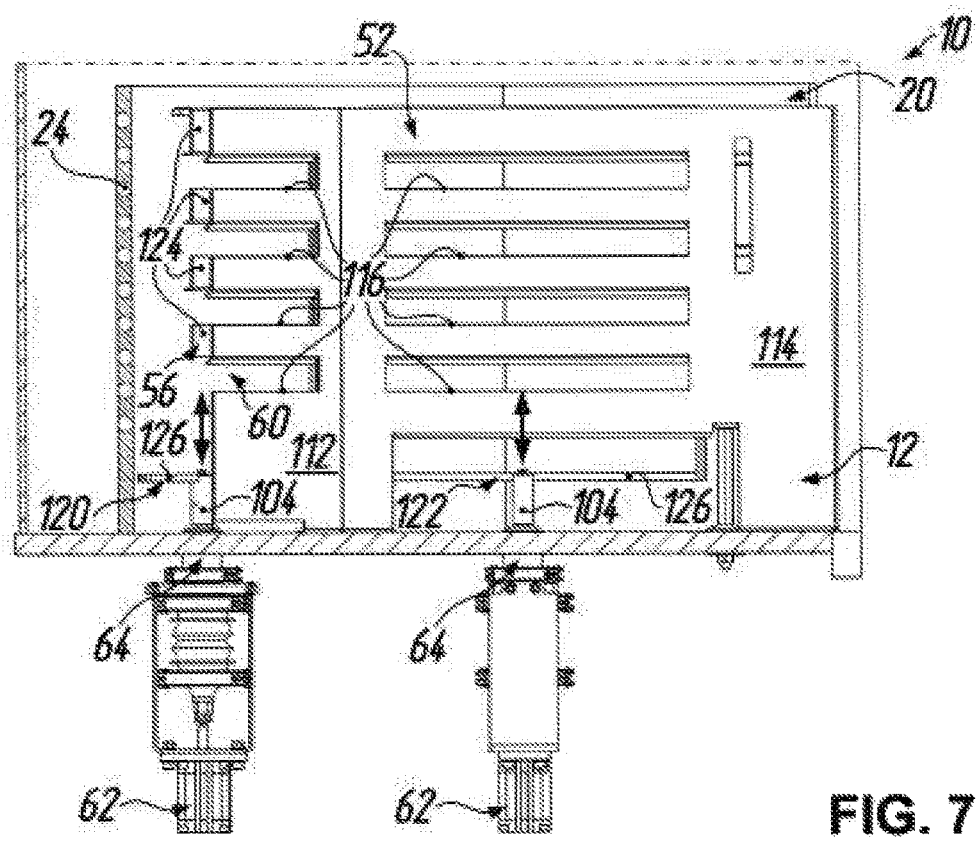
FIG. 7 shows a sectional view of the box coating apparatus according to FIG. 1 in correspondence with the section line VII-VII in FIG. 6, with movable shutter elements of the shutter portion of the second shield arrangement being situated in the open pumping position in which apertures in associated fixed shield elements of the second shield arrangement remain uncovered by the shutter elements.
Figure 8:
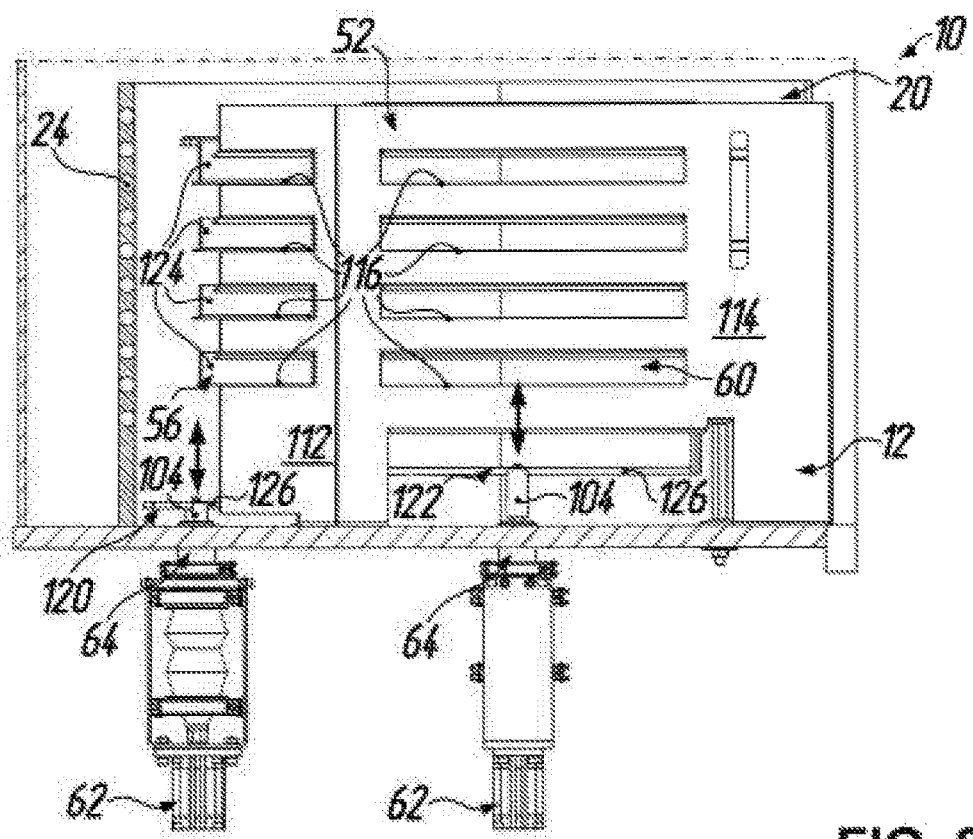
FIG. 8 shows a sectional view of the box coating apparatus according to FIG. 1 corresponding to the section shown in FIG. 7, wherein however the right-hand side shutter element only is situated in the open pumping position, as in FIG. 7, whereas the left-hand side shutter element is situated in the closed shielding position in which the apertures in the associated fixed shield element are covered from behind by complementary masking areas of the shutter element.

FIGS. 7 and 8 further illustrate, taking the middle shield element 112 and the associated shutter element 120 as example, that the shutter element 118, 120, 122 assigned to the respective shield element 110, 112, 114 can be moved relative to the respective shield element 110, 112, 114 by way of the related actuator 62 in order to selectively a) cover the apertures 116 in the respective shield element 110, 112, 114 with the masking areas 124 of the assigned shutter element 118, 120, 122 in the shielding position of the shutter portion 56 of the second shield arrangement 52 (see FIG. 8; connecting shaft 104 of the actuator 62 retracted), or b) uncover the apertures 116 of the respective shield element 110, 112, 114 by the masking areas 124 of the assigned shutter element 118, 120, 122 in the pumping position of the shutter portion 56 of the second shield arrangement 52 (cf. FIG. 7; connecting shaft 104 of the actuator 62 extended) so as to substantially clear the passageway 60 through the apertures 116. In this instance (up and down movement of the shutter elements as depicted with the double arrows in FIGS. 7 and 8) gravity helps to set the shielding position of the shutter portion 56 as the original state into which the shutter elements 118, 120, 122 return once actuation by the actuators 62 has been stopped.

As is evident from FIGS. 7 and 8 in particular, the shutter elements 118, 120, 122 of the shutter portion 56 are arranged to be linearly moved relative to the related shield elements 110, 112, 114, and in parallel therewith. Suitable provision is made (not detailed in the drawings) that the shutter elements 118, 120, 122 cannot rotate about the axial movement axes of the related actuators 62 as they are linearly moved.

Figure 9:
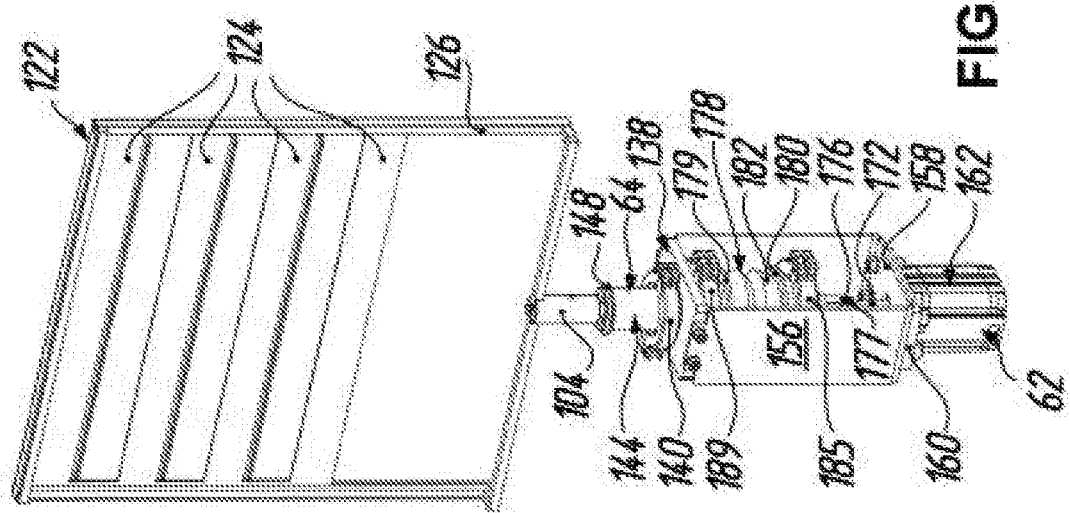
FIG. 9 shows a perspective view of one of the shutter elements with the assigned actuator of the second shield arrangement of the box coating apparatus according to FIG. 1, isolated therefrom, obliquely from above and front right, and to an enlarged scale.
Figure 10:
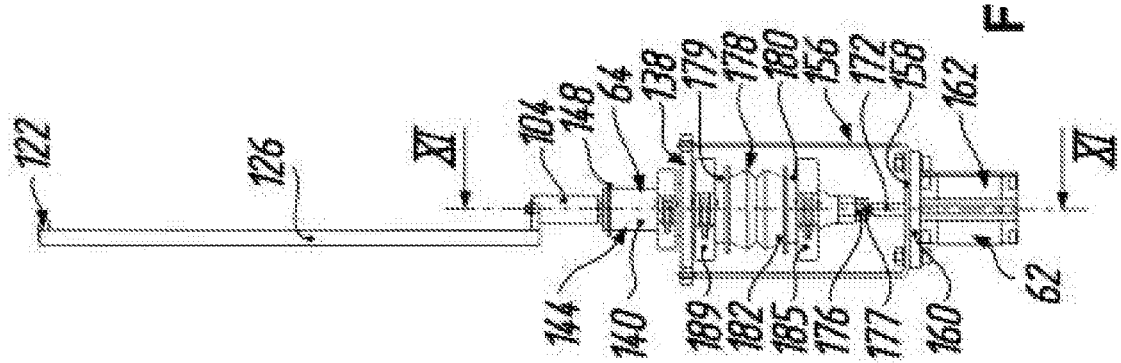
FIG. 10 shows a side view of the shutter element and actuator combination illustrated in FIG. 9 from the left-hand side in FIG. 9.
Figure 11:
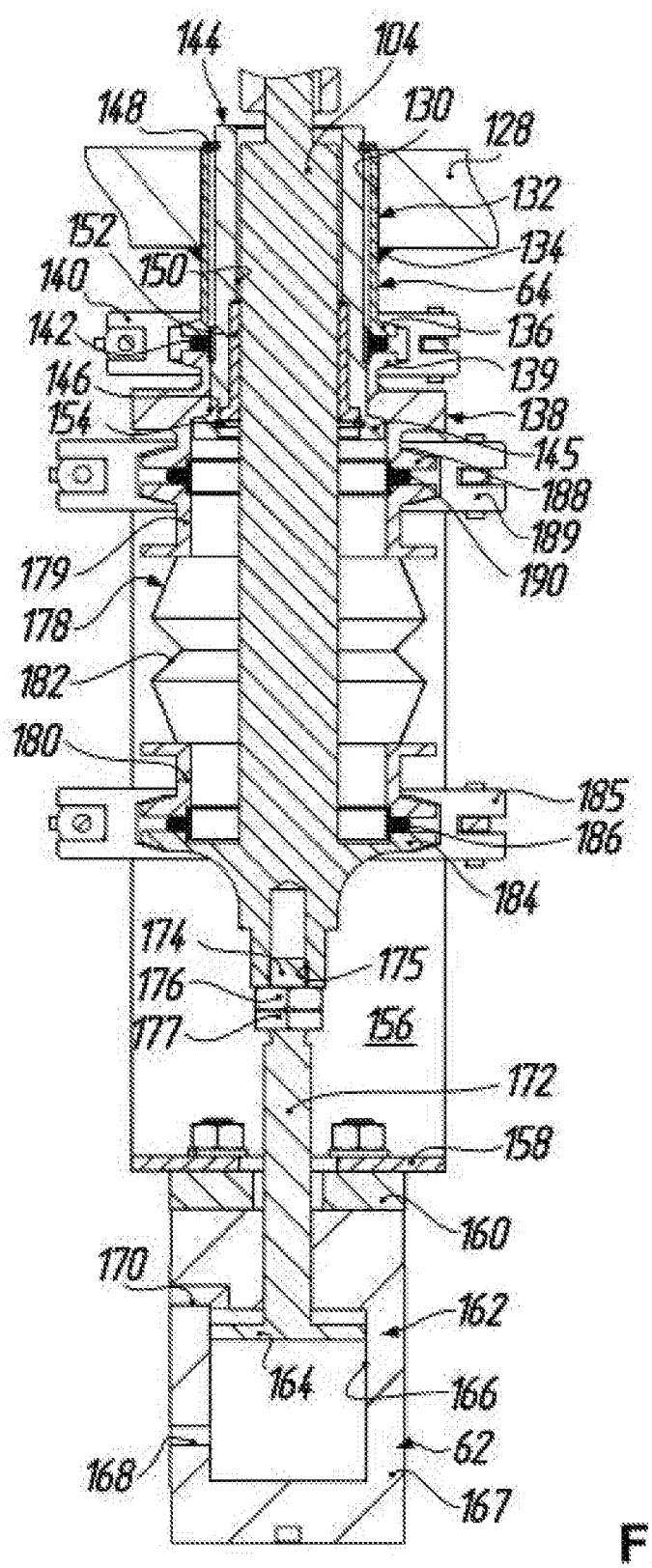
FIG. 11 shows a cut-out sectional view, to an enlarged scale, of the shutter element and actuator combination illustrated in FIG. 9 in correspondence with the section line XI-XI in FIG. 10.
Figure 12:
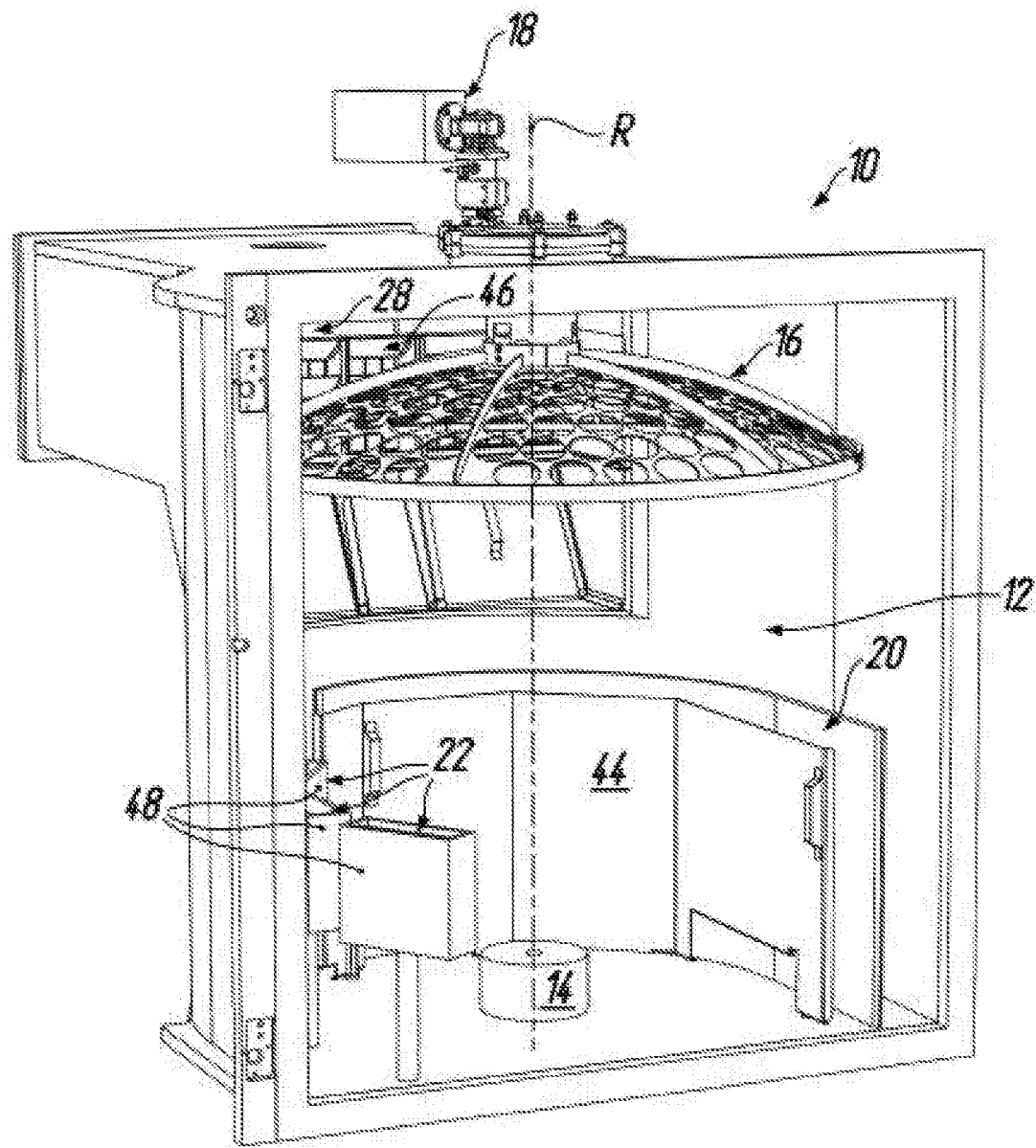
FIG. 12 shows a perspective view of a known box coating apparatus, obliquely from above and front left, wherein the Meissner trap and a chamber appendage to the vacuum chamber that accommodates parts of the high vacuum valve mechanism are each protected against deposition of the evaporated material by a full and fixed shield.
Figure 13:
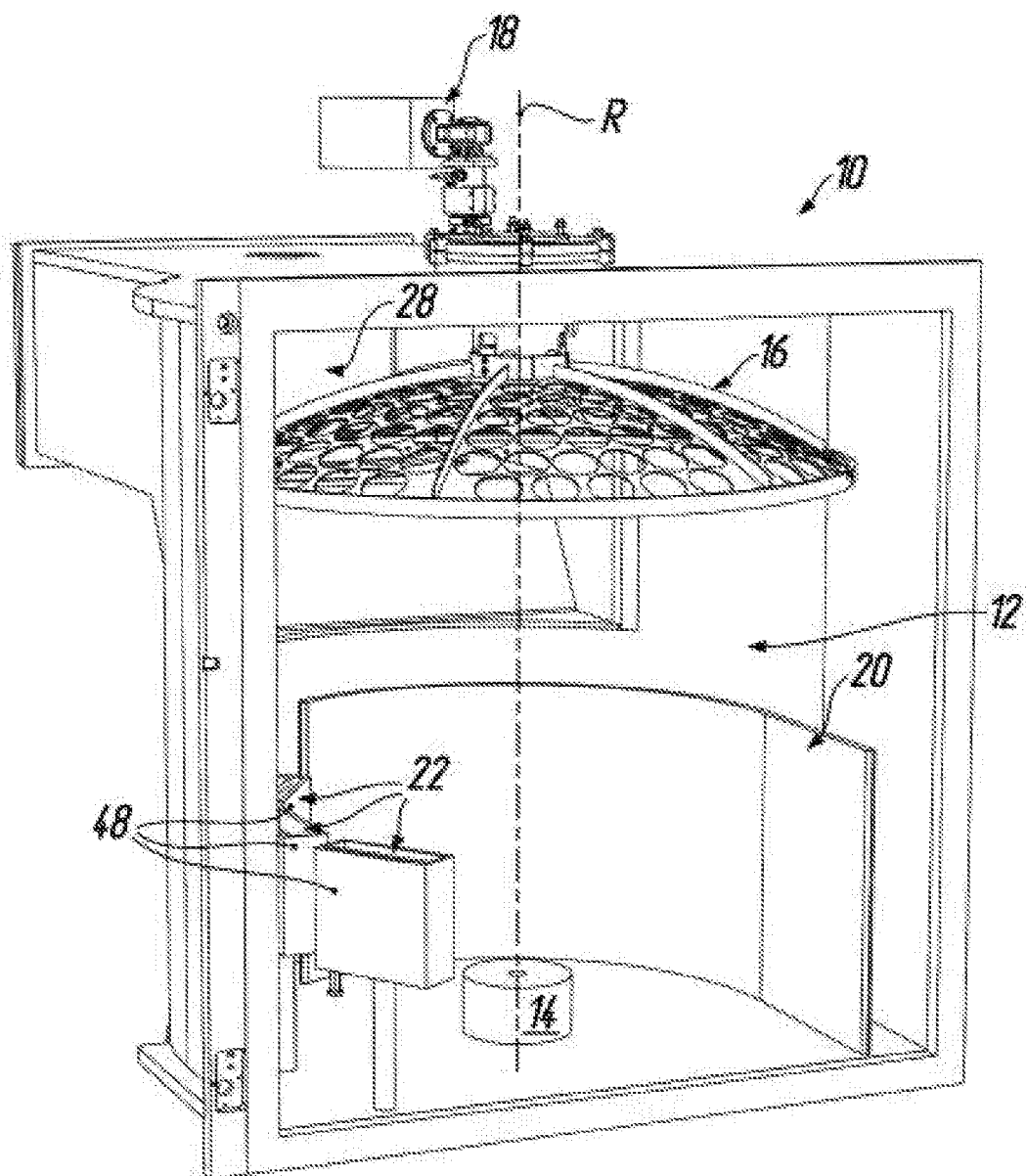
FIG. 13 shows a perspective view of the known box coating apparatus according to FIG. 12, obliquely from above and front left, wherein, as compared to FIG. 12, the fixed shield assigned to the Meissner trap and the fixed shield assigned to the high vacuum valve mechanism have been omitted for illustrative purposes.

Further details of the actuator 62 and the air-vacuum feed-through used throughout the present embodiment of the box coating apparatus 10 can be taken from FIGS. 9 to 11, wherein FIG. 11 shows the actuator 62 and the air-vacuum feed-through 64 in a state mounted to a wall 128 of the vacuum chamber 12.

According to FIG. 11, the wall 128 of the vacuum chamber 12 is provided with a through bore 130, in which a metallic sleeve 132 is fixedly and sealingly mounted by welding (welding bead 134). The sleeve 132 has an outer end provided with a collar 136 that serves to sealingly clamp to the sleeve 132 an adapter plate 138 via an upper collar 139 thereof by means of a clamp 140 and an O-ring 142. A bushing 144 having an enlarged counter bearing portion 145 at a lower end thereof is tightly accommodated in a stepped bore 146 through the adapter plate 138 and extends through the sleeve 132 with an upper end, where the bushing 144 is secured to the sleeve 132 and the adapter plate 138 by a retaining ring 148. The bushing 144 itself is provided with a stepped bore 150 for accommodating a sliding bush 152, which is secured in the stepped bore 150 of the bushing 144 by another retaining ring 154 and serves to guide the connecting shaft 104 of the actuator 62 in the manner of a slide bearing.

As can be taken from FIGS. 9 and 10 in particular, the adapter plate 138 generally has a rectangular shape as seen from above and forms part of a mounting arrangement that further comprises a U-shaped bracket 156 bolted to the adapter plate 138. A base portion 158 of the U-shaped bracket 156 serves to mount a flange plate 160 provided for flange-mounting of a pneumatically actuated piston-cylinder-arrangement 162 of the actuator 62.

According to FIG. 11, the piston-cylinder-arrangement 162 has a piston 164 slidingly arranged in a cylinder chamber 166 of a cylinder housing 167 of the piston-cylinder-arrangement 162. Pressurized air can be introduced into the cylinder chamber 166 via pressurized air connections 168, 170 provided in the cylinder housing 167. Accordingly, the piston 164 can pneumatically be acted upon either from below or from above in FIG. 11, depending on the desired direction of movement of the connecting shaft 104.

To transfer the pressure difference induced motion of the piston 164 to the connecting shaft 104 of the actuator 62 a piston rod 172 is attached to the piston 164, which extends through related bores in the cylinder housing 167, the flange plate 160 and the base portion 158 of the U-shaped bracket 156 to be connected to the connecting shaft 104 via a screw connection. To be more precise, a free end of the piston rod 172 is provided with a threaded end portion 174 that is screwed into a threaded bore 175 at a face side of the connecting shaft 104 and secured in place by a nut 176 and a lock nut 177.

Further, a metallic bellows 178 is provided, that has two end ring portions 179, 180 with a substantially U-shaped cross section, which are sealingly attached to a bellows section 182 inbetween. As can be taken from FIG. 11, the connecting shaft 104 is provided with a collar 184 near the lower end thereof, which serves to sealingly clamp to the connecting shaft 104 the lower end ring portion 180 of the metallic bellows 178 by means of a clamp 185 and an O-ring 186. The upper end ring portion 179 of the metallic bellows 178 is sealingly clamped to a lower collar 188 of the adapter plate 138 by means of another clamp 189 and an O-ring 190.

Finally, as is apparent from the foregoing, the piston-cylinder-arrangement 162 of the actuator 62 can be pneumatically loaded via the pressurized air connections 168, 170 to either lift or lower the connecting shaft 104 via the piston 164 and the piston rod 172. As a result of this, the related shutter portion 54, 56 can selectively be switched from the closed shielding position to the open pumping position, and vice versa, depending on the mounting orientation of the actuator 62. In doing so any vacuum within the vacuum chamber 12 will be present down to or up to the collar 184 of the connecting shaft 104, as the case may be depending on the mounting orientation of the actuator 62, but cannot escape because of the air-vacuum feed-through 64 with its metallic bellows 178.

A box coating apparatus for coating of substrates comprises a vacuum chamber which contains an evaporation source. A substrate holder is disposed vis-à-vis to the evaporation source so that evaporated material can impinge on substrates held by the substrate holder. Besides the evaporation source and the substrate holder, at least one further functional component is provided, namely a Meissner trap and/or a high vacuum valve mechanism, to which a shield arrangement is assigned to prevent evaporated material from impinging on said component. This shield arrangement has a shutter portion which can be transferred from a closed shielding position in which it covers a passageway through the shield arrangement and serves to shield said component, to an open pumping position in which it substantially clears the passageway to allow essentially free passage for gases and vapor, and vice versa.

Variations and modification are possible without departing from the scope and spirit of the present invention as defined by the appended claims.

We claim:

1. A box coating apparatus for vacuum coating of substrates, in particular spectacle lenses, comprising a vacuum chamber which can be evacuated by a pumping arrangement and contains an evaporation source for evaporating coating material, a substrate holder for holding a plurality of substrates being disposed in said vacuum chamber relative to said evaporation source so that coating material evaporated by said evaporation source can impinge on substrates held by said substrate holder, wherein, besides said evaporation source and said substrate holder, at least one functional component is provided, namely at least one of a Meissner trap and a high vacuum valve mechanism, to which in said vacuum chamber a shield arrangement is located between said evaporation source and said at least one functional component, characterized in that said shield arrangement assigned to said Meissner trap and/or said high vacuum valve mechanism is constructed and immovably positioned without shielding, during operation, said substrate holder from said evaporation source such that coating material evaporated by said evaporation source can impinge on substrates held by said substrate holder and said shield arrangement comprises a shutter portion which can selectively be moved reciprocally to and from a closed shielding position and an open pumping position, said closed shielding position being when said shutter portion covers a passageway leading through said shield arrangement, while said shutter portion serves to shield said functional component together with a remainder of said shield arrangement so as to prevent coating material evaporated by said evaporation source from impinging on said at least one functional component, and said open pumping position being when said shutter portion substantially clears said passageway to allow essentially free passage for gases and vapor.

2. The box coating apparatus according to claim 1, characterized in that said shield arrangement further has at least one fixed shield element provided with at least one aperture, whereas said shutter portion comprises at least one movable shutter element provided with at least one masking area which is adapted in size and geometry to substantially cover said aperture in said shield element, wherein said shutter element can be moved relative to said shield element in order to selectively cover said aperture of said shield element with said masking area of said shutter element in the shielding position of said shutter portion, or uncover said aperture of said shield element by said masking area of said shutter element in the pumping position of said shutter portion so as to substantially clear said passageway through said aperture.

3. The box coating apparatus according to claim 2, characterized in that said shutter element of said shutter portion is arranged to be linearly moved relative to said shield element of said shield arrangement.

4. The box coating apparatus according to claim 3, characterized in that said shutter element of said shutter portion is arranged to be moved in parallel with said shield element of said shield arrangement.

5. The box coating apparatus according to claim 2, characterized in that said shutter element of said shutter portion is arranged to be moved in parallel with said shield element of said shield arrangement.

6. The box coating apparatus according to claim 1, characterized in that said shield arrangement further has at least one fixed shield element provided with at least one opening area, whereas said shutter portion comprises at least one slat element which is located in or adjacent to said opening area and arranged to be pivoted about a pivot axis that is oriented transverse with respect to said opening area, wherein said slat element has a wide face side and a narrow edge side and can be pivoted about said pivot axis into a state in which its face side essentially faces said evaporation source in the shielding position of said shutter portion, or into a state in which a surface area of its edge side only restricts a free cross-section of said opening area of said shield element in said pumping position of said shutter portion so as to substantially clear said passageway through said opening area.

7. The box coating apparatus according to claim 6, characterized in that said shutter portion comprises at least two slat elements located in or adjacent to said opening area and arranged to be pivoted about pivot axes extending in parallel to one another and oriented transverse with respect to said opening area.

8. The box coating apparatus according to claim 7, characterized in that said slat elements are coupled by a connecting piece to be pivotable about their respective pivot axes at the same time and in the same direction of rotation.

9. The box coating apparatus according to claim 8, characterized in that said at least one slat element is biased by a spring element into the state in which a surface area of its edge side only restricts the free cross-section of said opening area of said shield element in said pumping position of said shutter portion.

10. The box coating apparatus according to claim 9, characterized in that said shutter portion or at least a part thereof can automatically be transferred from its closed shielding position to its open pumping position, and vice versa.

11. The box coating apparatus according to claim 10, characterized in that said shutter portion or at least a part thereof is operatively connected to an actuator that serves to automatically transfer said shutter portion or said part thereof from its closed shielding position to its open pumping position, and vice versa.

12. The box coating apparatus according to claim 11, characterized in that said actuator is located outside of said vacuum chamber.

13. The box coating apparatus according to claim 12, characterized in that said actuator is operatively connected to said shutter portion or at least a part thereof via an air-vacuum feed-through.

14. The box coating apparatus according to claim 13, characterized in that said actuator comprises a pneumatically actuated piston-cylinder-arrangement for selectively switching from said closed shielding position to said open pumping position of said shutter portion, and vice versa.

15. The box coating apparatus according to claim 14, characterized in that said actuator is operatively connected to said connecting piece in order to simultaneously pivot said slat elements by one and the same actuator.

16. The box coating apparatus according to claim 6, characterized in that said at least one slat element is biased by a spring element into the state in which a surface area of its edge side only restricts the free cross-section of said opening area of said shield element in said pumping position of said shutter portion.

17. The box coating apparatus according to claim 1, characterized in that said shutter portion or at least a part thereof can automatically be transferred from its closed shielding position to its open pumping position, and vice versa.

18. The box coating apparatus according to claim 17, characterized in that said shutter portion or at least a part thereof is operatively connected to an actuator that serves to automatically transfer said shutter portion or said part thereof from its closed shielding position to its open pumping position, and vice versa.

19. The box coating apparatus according to claim 18, characterized in that said actuator is located outside of said vacuum chamber.

20. The box coating apparatus according to claim 19, characterized in that said actuator is operatively connected to said shutter portion or at least a part thereof via an air-vacuum feed-through.

21. The box coating apparatus according to claim 11, characterized in that said actuator is operatively connected to said connecting piece in order to simultaneously pivot said slat elements by one and the same actuator.

\* \* \* \* \*